US008284557B2

(12) United States Patent
Tsukada et al.

(10) Patent No.: US 8,284,557 B2
(45) Date of Patent: Oct. 9, 2012

(54) CIRCUIT BOARD, MOUNTING STRUCTURE, AND METHOD FOR MANUFACTURING CIRCUIT BOARD

(75) Inventors: Yutaka Tsukada, Yasu (JP); Kimihiro Yamanaka, Yasu (JP); Kenji Terada, Yasu (JP)

(73) Assignee: Kyocera Corporation, Kyoto (JP)

( * ) Notice: Subject to any disclaimer, the term of this patent is extended or adjusted under 35 U.S.C. 154(b) by 357 days.

(21) Appl. No.: 12/738,606

(22) PCT Filed: Oct. 17, 2008

(86) PCT No.: PCT/JP2008/068894
§ 371 (c)(1),
(2), (4) Date: May 18, 2010

(87) PCT Pub. No.: WO2009/051239
PCT Pub. Date: Apr. 23, 2009

(65) Prior Publication Data
US 2010/0254098 A1    Oct. 7, 2010

(30) Foreign Application Priority Data

Oct. 18, 2007  (JP) .................................. 2007-271445

(51) Int. Cl.
*H05K 1/00* (2006.01)
*H05K 1/18* (2006.01)
*H05K 7/00* (2006.01)
(52) U.S. Cl. ....................................................... 361/748
(58) Field of Classification Search .................. 361/794, 361/795; 174/255, 261, 262, 263
See application file for complete search history.

(56) References Cited

U.S. PATENT DOCUMENTS

| | | | |
|---|---|---|---|
| 6,222,740 B1 | 4/2001 | Bovensiepen et al. | 361/795 |
| 6,722,031 B2* | 4/2004 | Japp et al. | 29/852 |
| 6,944,946 B2* | 9/2005 | Japp et al. | 29/852 |
| 6,996,902 B2* | 2/2006 | Suzuki et al. | 29/852 |
| 7,282,797 B2* | 10/2007 | Emrick et al. | 257/702 |
| 7,696,063 B2* | 4/2010 | Tsuchiya | 438/455 |
| 7,968,427 B2* | 6/2011 | Sugiyama et al. | 438/455 |
| 7,981,245 B2* | 7/2011 | Egitto et al. | 156/308.2 |
| 8,151,456 B2* | 4/2012 | Maehara et al. | 29/852 |
| 8,186,052 B2* | 5/2012 | Iida et al. | 29/852 |
| 2002/0050402 A1* | 5/2002 | Japp et al. | 174/256 |
| 2003/0066683 A1* | 4/2003 | Suzuki et al. | 174/262 |
| 2003/0196749 A1* | 10/2003 | Japp et al. | 156/250 |

(Continued)

FOREIGN PATENT DOCUMENTS
JP   05-235544   9/1993
(Continued)

*Primary Examiner* — Lisa Lea Edmonds
*Assistant Examiner* — Xanthia C Cunningham
(74) *Attorney, Agent, or Firm* — DLA Piper LLP (US)

(57) ABSTRACT

Provided are a circuit board which meets requirement of suppressing peeling of a through hole conductor, a mounting structure and a method for manufacturing the circuit board. A circuit board (2) is provided with a base (5) and a through hole conductor (11). The base is provided with a fiber layer (9) and a through hole (S). The fiber layer has a single fiber (8) arranged along one direction and a resin for covering the single fiber (8). The through hole (S) penetrates the fiber layer (9), and the through hole conductor is formed in the through hole. The single fiber (8) partially protrudes to the side of the through hole conductor (11) from an inner wall surface of the through hole (S), and the protruded part is covered with the through hole conductor (11).

9 Claims, 10 Drawing Sheets

U.S. PATENT DOCUMENTS

| | | | |
|---|---|---|---|
| 2004/0009683 A1* | 1/2004 | Hiraoka et al. | 439/75 |
| 2008/0127604 A1* | 6/2008 | Schiffmann et al. | 52/745.2 |
| 2009/0057875 A1* | 3/2009 | Aoki et al. | 257/702 |
| 2009/0061242 A1* | 3/2009 | Miller et al. | 428/457 |
| 2009/0085182 A1* | 4/2009 | Yamazaki et al. | 257/679 |
| 2009/0195387 A1* | 8/2009 | Koyama et al. | 340/572.1 |
| 2009/0200557 A1* | 8/2009 | Kamata | 257/66 |
| 2009/0203174 A1* | 8/2009 | Ichijo et al. | 438/151 |
| 2010/0095523 A1* | 4/2010 | Niki | 29/850 |
| 2010/0159647 A1* | 6/2010 | Ito et al. | 438/124 |

FOREIGN PATENT DOCUMENTS

| | | |
|---|---|---|
| JP | 10-215042 | 8/1998 |
| JP | 10-508720 | 8/1998 |
| JP | 11-238971 | 8/1999 |
| JP | 2007-115840 | 5/2007 |
| WO | WO 96/09158 A1 | 3/1996 |

* cited by examiner

CIRCUIT BOARD, MOUNTING STRUCTURE, AND METHOD FOR MANUFACTURING CIRCUIT BOARD

TECHNICAL FIELD

The present invention relates to a circuit board that is used in various audio-visual instruments, household appliances, and electronic instruments such as communication devices, computer devices, and peripheral devices of the computer devices and a mounting structure in which a semiconductor element is mounted on the circuit board.

BACKGROUND ART

Conventionally, a resin circuit board is used as a circuit board on which a semiconductor element such as an IC (Integrated Circuit) and an LSI (Large Scale Integration) is mounted.

The circuit board includes a through hole that penetrates in a vertical direction, a cylindrical through-hole conductor that is formed along an inner wall surface of the through hole, and a column-shaped insulator with which a region surrounded by the through-hole conductor is filled.

As illustrated in FIG. 10, the through hole can be made by drilling an insulating layer constituting the circuit board, and a through-hole conductor 11X can be plated on an inner wall surface of a through hole SX. A region surrounded by the through-hole conductor 11X is filled with a thermosetting resin, and the thermosetting resin is thermally cured to form an insulator 14X (see Japanese Unexamined Patent Publication No. 10-215042).

However, in the circuit board described in Japanese Unexamined Patent Publication No. 10-215042, the through-hole conductor is formed into a cylindrical shape, and the insulating layer constituting the circuit board differs from the through-hole conductor in a thermal expansion coefficient. Therefore, when heat is applied to the circuit board from the outside, occasionally the through-hole conductor is peeled off from the inner wall surface of the through hole.

DISCLOSURE OF THE INVENTION

An object of the present invention is to provide a circuit board that meets the need to suppress peel-off of a through-hole conductor, a mounting structure, and a circuit board manufacturing method.

In order to solve the above-mentioned problem, a circuit board according to an aspect of the present invention includes a base and a through-hole conductor that is disposed in the base. The base includes a fiber layer and a through hole which penetrates the fiber layer. The fiber layer includes a plurality of single fibers arrayed in one direction and a resin coating the single fibers. The through-hole conductor is formed in the through hole. Part of the single fiber is protruded from an inner wall surface of the through hole toward the through-hole conductor side. The protruded part is coated with the through-hole conductor.

A circuit board manufacturing method according to another aspect of the present invention includes the steps of preparing a base that includes a fiber layer and forming a through hole in the fiber layer. The fiber layer includes a plurality of single fibers and a resin with which the single fibers are coated. Part of the single fiber is protruded from an inner wall surface of the through hole. The step of forming the through hole includes the steps of forming a penetration hole in the fiber layer; and protruding part of the single fiber in the inner wall surface of the penetration hole to form the penetration hole into the through hole. The part of the single fiber is protruded by etching part of the resin in the inner wall surface of the penetration hole. The manufacturing method further includes the step of forming a through-hole conductor along the inner wall surface of the through hole. The through-hole conductor is formed such that the part of the single fiber protruded from the inner wall surface of the through hole is coated therewith.

Figure 1:
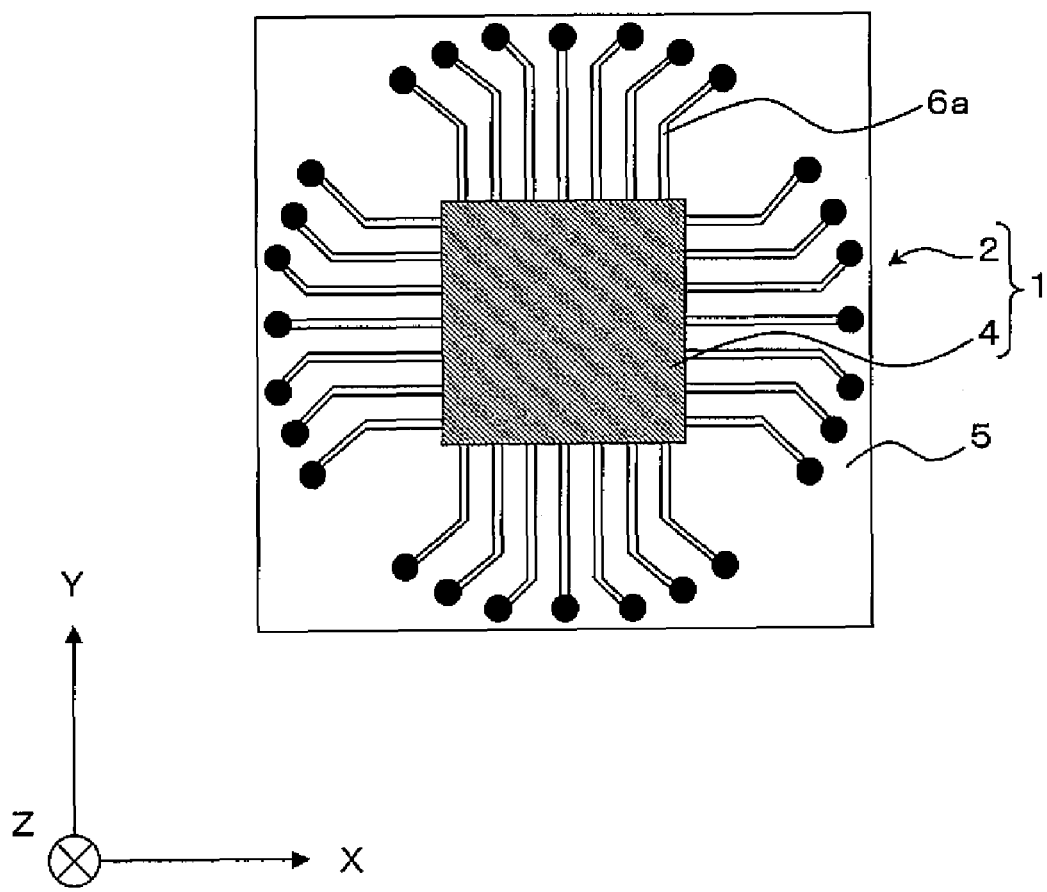
FIG. 1 is a plan view of a mounting structure according to an embodiment of the present invention.

DESCRIPTION OF REFERENCE NUMERALS 1 mounting structure
2 circuit board
3 bump
4 semiconductor element
5 base
6 conductive layer
6a signal line
6b ground layer
7 insulating layer
7a adhesion layer
7b film layer
8 single fiber
8a projection
8s recess
9 fiber layer
10 resin layer
11 through-hole conductor
12 via conductor
13 filler
14 insulator
15 nonmetallic inorganic filler
16 fiber sheet
S through hole

BEST MODE FOR CARRYING OUT THE INVENTION

A mounting structure including a circuit board according to an embodiment of the present invention is described in detail with reference to the drawings. For example, the mounting structure is used in various audio-visual instruments, household appliances, and electronic instruments such as communication devices, computer devices, and peripheral devices of the computer devices.

Figure 2:
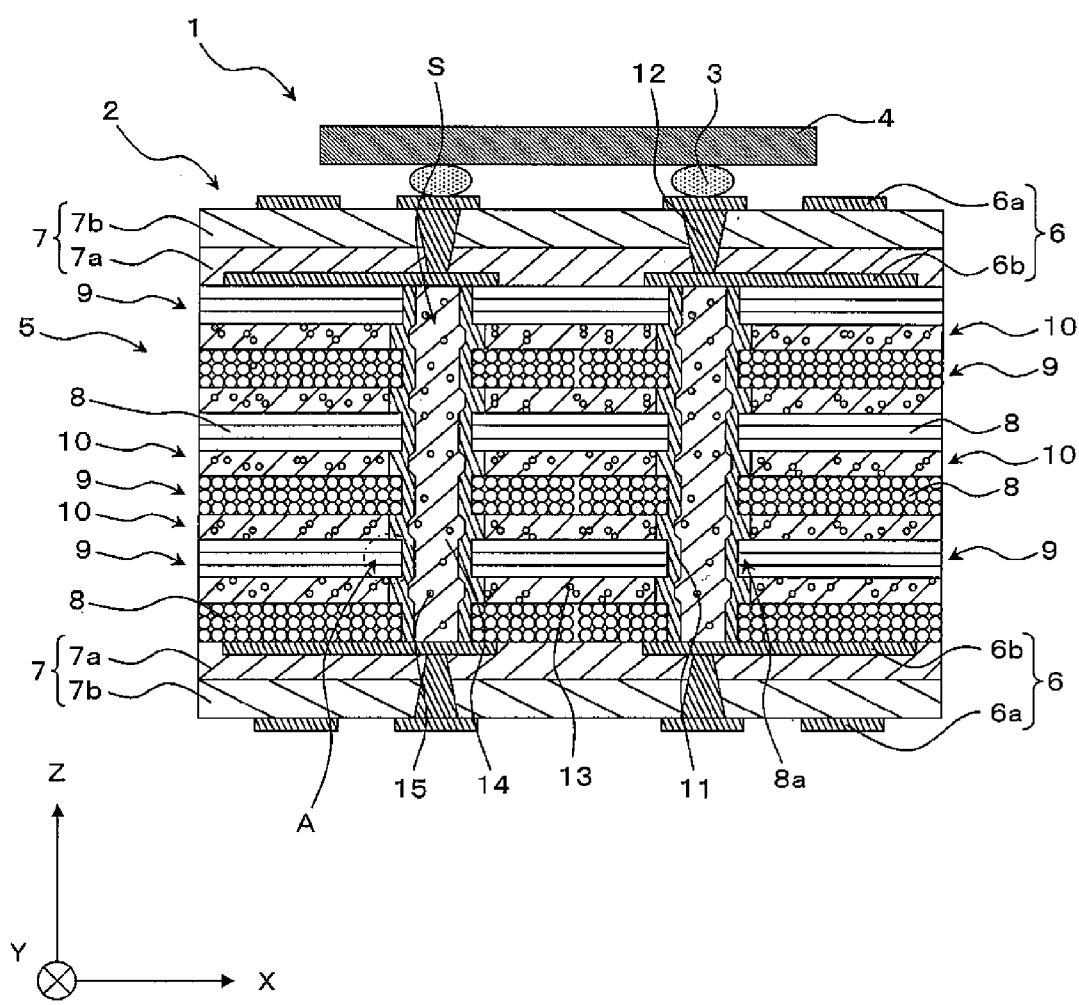
FIG. 2 is a sectional view of a mounting structure according to an embodiment of the present invention.

FIG. 1 is a plan view of a mounting structure 1 of the present embodiment, and FIG. 2 is a sectional view of the mounting structure 1 of the present embodiment. A mounting structure 1 of the present embodiment includes a circuit board 2 and a semiconductor element 4, such as an IC or an LSI, which is flip-chip-mounted on the circuit board 2 with a bump 3 such as solder interposed therebetween.

The circuit board 2 includes a base 5, conductive layers 6 that are laminated on one principal surface and the other principal surface of the base 5, and insulating layers 7. The base 5 is a laminated body in which fiber layers 9 and resin layers 10 are alternately laminated. The fiber layer 9 is formed by impregnating many single fibers 8 arrayed along one direction with resin. A through hole S penetrating in a vertical direction and a through-hole conductor 11 formed along an inner wall surface of the through hole S are formed in the base 5.

The conductive layer 6 includes a signal line 6a that transmits a predetermined electric signal and a flat-plate ground layer 6b that has a function of setting the semiconductor element 4 to a common potential, for example, a ground potential. The signal line 6a is disposed so as to be opposite to the ground layer 6b with the insulating layer 7 interposed therebetween. For example, the conductive layer 6 is made of a metallic material such as copper, silver, gold, aluminum, nickel, and chromium.

The insulating layer 7 includes an adhesion layer 7a and a film layer 7b. The film layer 7b adheres to the base 5 with the adhesion layer 7a interposed therebetween. A thermosetting resin or a thermoplastic resin may be used as the adhesion layer 7a. For example, at least one of a polyimide resin, an acrylic resin, an epoxy resin, a urethane resin, a cyanate resin, a silicon resin, and a bismaleimide triazine resin can be used as the thermosetting resin. The thermoplastic resin is desirably made of a material having a softening temperature of 200° C. or more since the thermoplastic resin is required to have heat resistance withstanding the heating during solder reflow. For example, a polyether ketone resin, a polyethylene terephthalate resin, and a polyphenylene ether resin can be used as the thermoplastic resin.

A thickness of the film layer 7b is precisely controlled in order to secure flatness of the circuit board 2. The film layer 7b is desirably made of an elastically deformable material that is excellent in heat resistance and hardness. For example, a polyparaphenylene benzbisoxazole resin, a wholly aromatic polyamide resin, a wholly aromatic polyester resin, and a liquid-crystal polymer resin can be used as the film layer 7b having the above-described characteristics. For example, the thickness of the film layer 7b is set to a range of 1 μm to 20 μm.

The film layer 7b is attached to the base 5 or conductive layer 6 with an adhesive material interposed therebetween, and the film layer 7b is heat-pressurized by, for example, a hot press machine, and then cooled to be fixed to the base 5 or conductive layer 6. The adhesive material is heated and then cooled, thereby solidified to form the adhesion layer 7a. The thickness of the insulating layer 7 is set to a range of 1 μm to 10 μm, for example.

A via conductor 12 is formed to penetrate the insulating layer 7 in the vertical direction. The via conductor 11 electrically connects the conductive layers 6 to each other that are located in different vertical positions. The via conductor 12 is formed into a tapered shape having a width becoming wider from one principal surface side of the base 5 toward one principal surface side of the circuit board 2 (from the other principal surface side of the base 5 toward the other principal surface side of the circuit board 2), and the via conductor 12 is made of a conductive material such as copper, silver, gold, aluminum, nickel, and chromium.

Figure 3A:
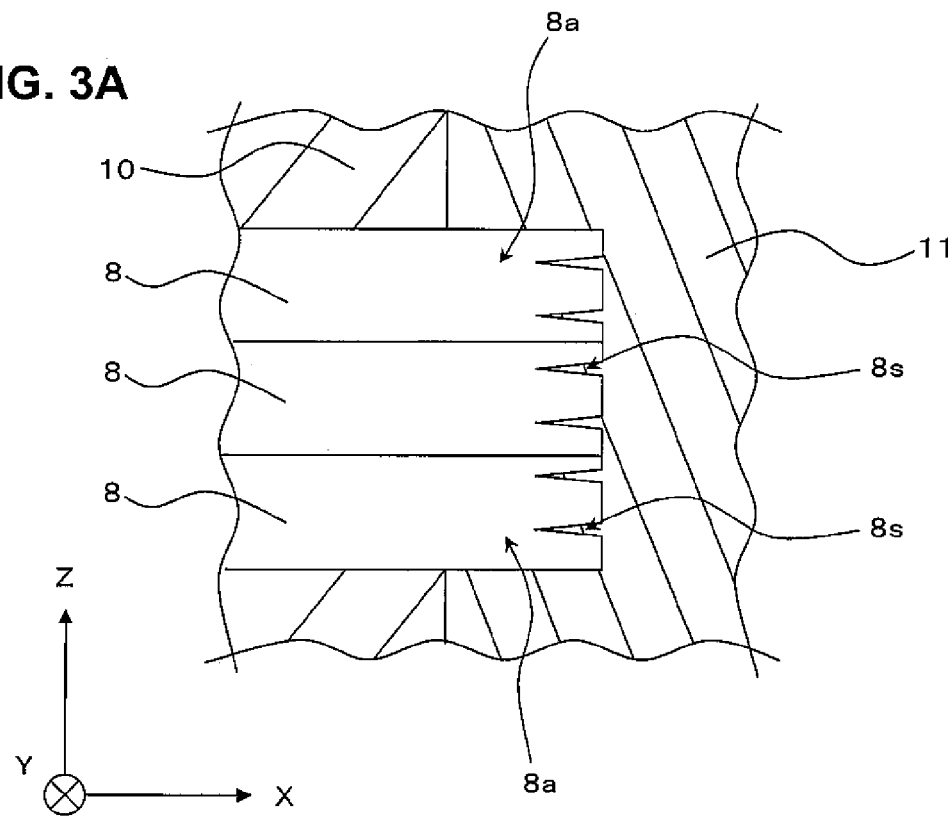
FIG. 3A is a sectional view of a projection according to an embodiment, of the present invention.
Figure 3B:
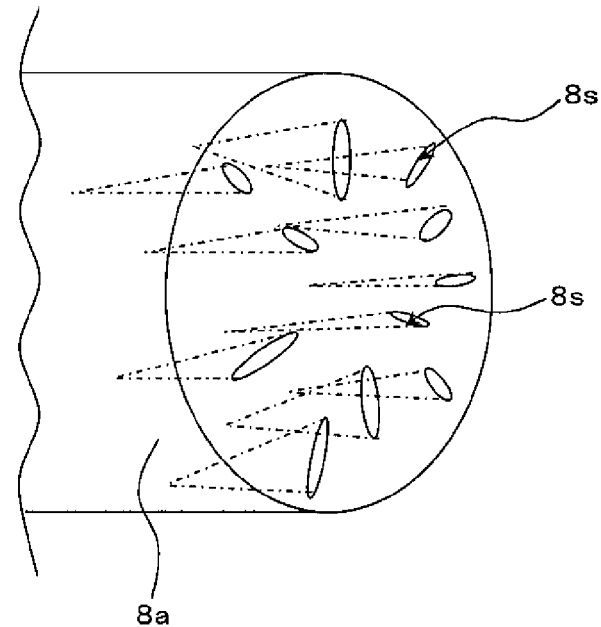
FIG. 3B is a perspective view of the projection according to the embodiment of the present invention.

The base 5 is described in detail. FIG. 3A is an enlarged sectional view of a portion A of FIG. 2 where the fiber layer 9 contacts the through-hole conductor 11. FIG. 3B is an enlarged perspective view of a projection. As illustrated in FIGS. 2 and 3, the fiber layer 9 maintains good rigidity of the base 5, and the fiber layer 9 is formed by laying the many single fibers 8.

The many unidirectionally-arrayed single fibers 8 constituting the fiber layer 9 are extended from one end of the fiber layer 9 to the other end. The single fiber 8 is made of a low thermal expansion resin such as a polyparaphenylene benzbisoxazole resin, a wholly aromatic polyamide resin, and a wholly aromatic polyester resin. In the single fiber 8, a thermal expansion coefficient in a sectional direction orthogonal to a longitudinal direction is larger than a thermal expansion coefficient in the longitudinal direction. The thermal expansion coefficient in the sectional direction of the single fiber 8 ranges from 40 ppm/° C. to 120 ppm/° C., and the thermal expansion coefficient in the longitudinal direction of the single fiber 8 ranges from −10 ppm/° C. to 10 ppm/° C. The thermal expansion coefficient is pursuant to JIS K7197. The single fiber 8 is formed in an elongated shape, a section orthogonal to the longitudinal direction thereof has a circular shape, and a diameter of the section ranges, for example, from 3 μm to 15 μm.

For the fiber layer 9, preferably the fiber layer 9 in which the single fibers 8 are arrayed along an X-direction and the fiber layer 9 in which the single fibers 8 are arrayed along a Y-direction orthogonal to the X-direction are alternately laminated. As a result, a difference in thermal expansion coefficient in the directions orthogonal to each other in the circuit board 2, caused by the difference between the thermal expansion coefficient in the longitudinal direction of the single fiber 8 and the thermal expansion coefficient in the sectional direction, can be reduced. Therefore, the deformation of the circuit board 2 during the thermal expansion can be reduced. Preferably, the number of fiber layers 9 in which the single fibers 8 are arrayed along the X-direction is the same as the number of fiber layers 9 in which the single fibers 8 are arrayed along the Y-direction. Accordingly, the number of the single fibers 8 arrayed along the X-direction and the number of the single fibers 8 arrayed along the Y-direction are brought close to each other, whereby the difference in thermal expansion coefficient in the directions orthogonal to each other in the circuit board 2 can be reduced to suppress the deformation of the circuit board 2 during the thermal expansion.

Preferably, a volume ratio of the single fiber 8 to the fiber layer 9 is set to a range of 30% by volume to 80% by volume. When the volume ratio of the single fiber 8 to the fiber layer 9 is not less than 30% by volume, the number of single fibers 8 included in the fiber layer 9 is sufficiently secured, and the excellent rigidity of the single fiber 8 has an influence on the fiber layer 9 to decrease warpage of the whole of base 5. When the volume ratio of the single fiber 8 to the fiber layer 9 is not more than 80% by volume, the number of bubbles entering between the single fibers 8 can be decreased in producing the fiber layer 9. As a result, electric reliability of the base 5 can be improved since a void formed by the bubbles can be reduced to decrease a possibility that the conductive material is deposited in the void from the conductive layer 6 and the like. For example, an epoxy resin, a bismaleimide triazine resin, a cyanate resin, a polyimide resin, and a polyphenylene ether resin can be used as the resin included in the fiber layer 9.

The resin layer 10 includes a resin, and the exemplary resin include an epoxy resin, a bismaleimide triazine resin, a cyanate resin, a polyimide resin, and a polyphenylene ether resin. The resin layer 10 may include many fillers 13. The inclusion of the fillers 13 in the resin layer 10 can adjust viscosity before the resin layer 10 is cured, and therefore the resin layer 10 can be formed while the thickness of the resin layer 10 is brought close to a desired value. The filler 13 is formed into a spherical shape, the diameter of the filler 13 is set to a range, for example, of 0.05 µm to 6 µm, and the thermal expansion coefficient ranges, for example, from −5 ppm/° C. to 5 ppm/° C. For example, the filler 13 is made of silicon oxide (silica), silicon carbide, aluminum oxide, aluminum nitride, or aluminum hydroxide.

The through hole S is formed to penetrate the base 5 in the vertical direction. Plural projections 8*a* are formed in the inner wall surface of the through hole S when the section in the vertical direction is viewed. The through-hole conductor 11 made of a conductive material such as copper, silver, gold, aluminum, nickel, chromium, or the like is formed along the inner wall surface of the through hole S. Part of the single fiber 8 is protruded from the inner wall surface of the through hole S, and the protruded part of the single fiber 8 constitutes the projection 8*a*. A surface of the projection 8*a* includes a cut surface of the single fiber 8 and part of a side surface of the single fiber 8.

In the base 5, the fiber layers 9 and the resin layers 10 are alternately laminated, and the projection 8*a* that is part of the single fiber 8 included in the fiber layer 9 is protruded from the inner wall surface of the through hole S, whereby the inner wall surface of the through hole S is formed into a continuously irregular shape. The fiber layers 9 and the resin layers 10 are alternately laminated, and the volume ratio of the single fiber 8 to the fiber layer 9 or the thickness of the resin layer 10 is adjusted, which allows adjustment of an interval between the projections 8*a*.

Preferably, the interval between the projections 8*a* ranges from 0.5 µm to 30 µm. When the interval between the projections 8*a* is not less than 0.5 µm, the projection 8*a* is easy to form, and advantageously the heat is easily transferred to the base 5 from the outside, a thermal stress applied to the through hole S at the time of the thermal expansion/thermal contraction of the base 5 can be retained at the projections 8*a*, a stress applied to the through hole can be dispersed, and a crack generated in the through-hole conductor 11 can be reduced even in a thin through hole. When the interval between the projections 8*a* is not more than 30 µm, advantageously the number of projections 8*a* per through hole S can be increased to evenly disperse the stress applied to the through hole, and therefore the crack generated in the through-hole conductor 11 can be reduced even in the thin through hole. The number of projections per through hole depends on the thickness of the substrate. However, it is effective to provide 2 to 5 projections in a thin substrate having the thickness of about 0.2 mm, and at least 10 projections in a thick substrate having the thickness of about 1 mm.

When the projections 8*a* are provided at regular intervals, the heat is easily transferred to the base 5 from the outside, the thermal stress applied to the through hole S at the time of the thermal expansion/thermal contraction of the base 5 can substantially evenly be applied to each of the projections 8*a*, the stress can be dispersed to suppress the generation of the crack in the inner wall surface of the through hole S. As a result, disconnection of the through-hole conductor 11 formed along the inner wall surface of the through hole S can be effectively suppressed.

Part of the through-hole conductor 11 is deposited such that the surface of the projection 8*a* is coated therewith, so that a contact area between the through-hole conductor 11 and the inner wall surface of the through hole S can be enlarged to enhance an adhesion between the through-hole conductor 11 and the inner wall surface of the through hole S. As a result, the through-hole conductor 11 can be effectively prevented from being peeled off from the inner wall surface of the through hole S. The enhancement of the adhesion can reduce the thickness of the through-hole conductor 11 or reduce the diameter of the through-hole conductor 11. Therefore, in forming the through-hole conductor 11, a possibility that a bubble or a plating solution invades into the through-hole conductor 11 can be reduced to enhance the strength of the through-hole conductor 11.

Because the through-hole conductor 11 is interposed even between the projections 8*a*, the through-hole conductor 11 suppresses the thermal expansion/thermal contraction in the thickness direction of the projection 8*a* caused by the heat from the outside, a change in distance between the projections 8*a* can be suppressed, and therefore the deformation of the base 5 can be prevented. The through-hole conductor 11 hardly falls out upward or downward from the base 5. As a result, the through-hole conductor 11 is less likely to be peeled off from the through hole S, and the electric connection of the through-hole conductor 11 can be stabilized to improve a manufacturing yield.

The through hole S is formed into a vertically symmetric shape, whereby the stress applied to the through hole S can be substantially evenly dispersed to effectively suppress the deformation of the base 5. For example, the thickness of the base 5 is set to a range of 100 µm to 1200 µm.

As illustrated in FIGS. 3A and 3B, recesses 8*s* are formed along the longitudinal direction of the single fiber 8 in an end portion of the projection 8*a* protruded from the inner wall surface of the through hole S. For example, in the single fiber 8 made of a polyparaphenylene benzbisoxazole resin, since molecules constituting the single fiber 8 are orientated along the lengthwise direction, the single fiber 8 tends to be easily torn along the lengthwise direction. Therefore, when forming the through hole S, the single fiber 8 is partially broken, and the recesses 8*s* are formed along the longitudinal direction of the single fiber 8 in the end portion of the projection 8*a*. The recess 8*s* is filled with part of the through-hole conductor 11, the adhesion between the projection 8*a* and the through-hole conductor 11 can be increased by an anchor effect, and the through-hole conductor 11 can be prevented from being peeled off from the inner wall surface of the through hole S. For example, the recess 8*s* is formed to have a size in the X-direction in a range of 0.1 µm to 10 µm. When the size in the X-direction of the recess 8*s* is less than 0.1 µm, it is difficult to exert the anchor effect. When the size in the X-direction of the recess 8*s* is more than 10 µm, resin characteristics are occasionally degraded by a laser beam or a chemical solution.

The recesses 8*s* are radially formed with respect to the section of the single fiber, 8, and the radially formed recesses 8*s* are filled with part of the through-hole conductor 11. Therefore, even if the thermal stress is applied to the through-hole conductor 11 from any direction, the positional relationship between the single fiber 8 and the through-hole conductor 11 is hardly changed, and the adhesion between the single fiber 8 and the through-hole conductor 11 can be effectively maintained.

The plural recesses 8s are formed, and preferably the plural recesses 8s are disposed so as to become symmetrical with respect to the direction in which the single fibers 8 are arrayed. The recesses 8s are formed in part of the inner wall surface of the through hole S, so that a high-frequency signal can be transmitted through a region where the recess 8s is not formed when the through-hole conductor 11 transmits the high-frequency signal. As a result, a resistance of the through-hole conductor 11 against the high-frequency signal can be reduced to improve the transmission characteristic of the high-frequency signal. Additionally, the plural recesses 8s are disposed so as to become symmetrical with respect to the direction in which the single fibers 8 are arrayed, so that the stress applied to the through-hole conductor 11 can be dispersed by the anchor effect of the recess 8s. Therefore, the possibility that the through-hole conductor 11 is broken can be reduced to improve the electric reliability of the circuit board 2.

When the fiber layers 9 in which the single fibers 8 are arrayed along the X-direction and the fiber layers 9 in which the single fibers 8 are arrayed along the Y-direction orthogonal to the X-direction are alternately laminated, the dispositions of the recesses 8s can be rotated by 90° in a round direction of the through hole S in the different fiber layers 9. As a result, because the recesses 8s can be disposed while dispersed in the inner wall surface of the through holes, the stress applied to the through-hole conductor 11 can be dispersed by the anchor effect of the recess 8s.

A region R surrounded by the through-hole conductor 11 is filled with an insulator 14 made of an insulating resin in order to provide the good flatness of the base 5. The through-hole conductor 11 electrically connects the conductive layers 6 to each other that are formed in the principal surface or the other principal surface of the base 5. The via conductor 12 can be formed immediately above or below the through hole S by filling the region R surrounded by the through-hole conductor 11 with the insulator 14, which contributes to miniaturization of the circuit board 2.

Figure 10:
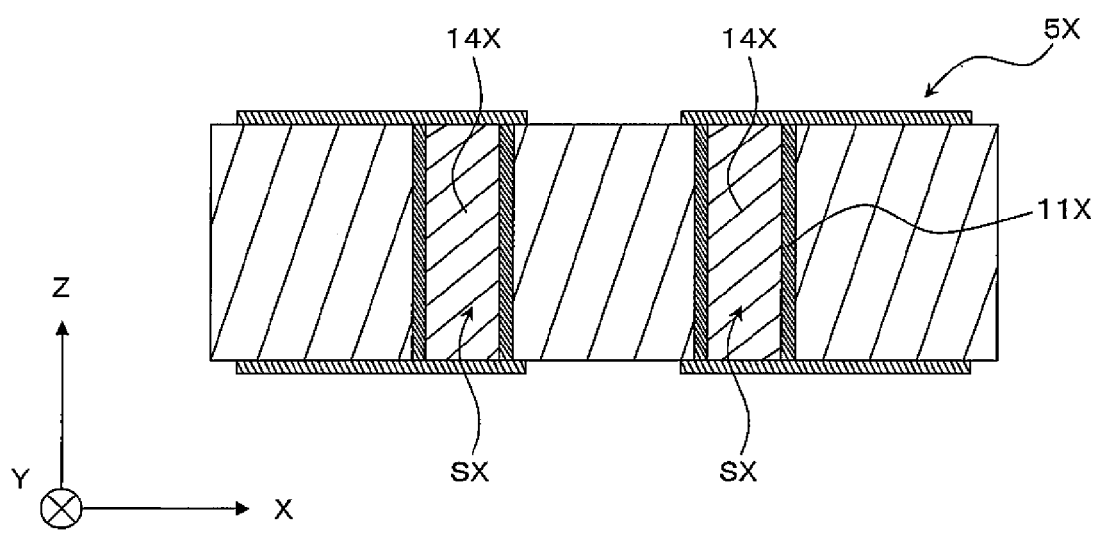
FIG. 10 is a sectional view of a conventional through-hole conductor illustrating a conventional technique.

The irregularity can be provided in the through-hole conductor 11 by forming the through-hole conductor 11 along the inner wall surface of the through hole S, and therefore the contact area with the insulator 14 can be enlarged. As a result, the adhesion between the insulator 14 and the through-hole conductor 11 can be increased compared with the cylindrical insulator as illustrated in FIG. 10, the peel-off between the insulator 14 and the through-hole conductor 11 can be suppressed to stabilize the electric connection of the through-hole conductor 11.

The insulator 14 includes nonmetallic inorganic fillers 15. The nonmetallic inorganic filler 15 has a spherical shape. For example, a diameter of the nonmetallic inorganic filler 15 is set to a range of 0.05 μm to 6 μm, and a thermal expansion coefficient of the nonmetallic inorganic filler 15 ranges from −5 ppm/° C. to 5 ppm/° C. For example, the nonmetallic inorganic filler 15 is made of silicon oxide (silica), silicon carbide, aluminum oxide, aluminum nitride, or aluminum hydroxide.

The insulator 14 includes the nonmetallic inorganic fillers 15 having the low thermal expansion coefficients, so that the thermal expansion coefficient of the insulator 14 can be brought close to the thermal expansion coefficient of the fiber layer 9 having the low thermal expansion coefficient. As a result, the expansion and contraction of the through-hole conductor 11 can be suppressed even from the inside of the through-hole conductor 11, and the possibility that the through-hole conductor 11 is broken can be effectively reduced.

The semiconductor element 4 is made of a material having the thermal expansion coefficient close to that of the insulating layer 7. For example, silicon, germanium, gallium arsenide, gallium arsenide phosphide, gallium nitride, and silicon carbide can be used as the semiconductor element 4. For example, the thickness of the semiconductor element 4 ranges from 0.1 mm to 1 mm.

As described above, in the present embodiment, the plural projections 8s are formed in the inner wall surface of the through hole S when the section in the vertical direction of the inner wall surface of the through hole S is viewed, and the through-hole conductor 11 is formed along the inner wall surface of the through hole S. Therefore, the through-hole conductor 11 can hardly be peeled off from the through hole S, the good electric connection of the through-hole conductor 11 can be maintained, and a circuit board that is excellent in the electric reliability to be able to improve the manufacturing yield and a mounting structure thereof can be provided.

A method for manufacturing the mounting structure 1 is described with reference to FIGS. 4 to 9.

The base 5 is prepared as a preliminary step of producing the mounting structure 1.

Figure 4A:
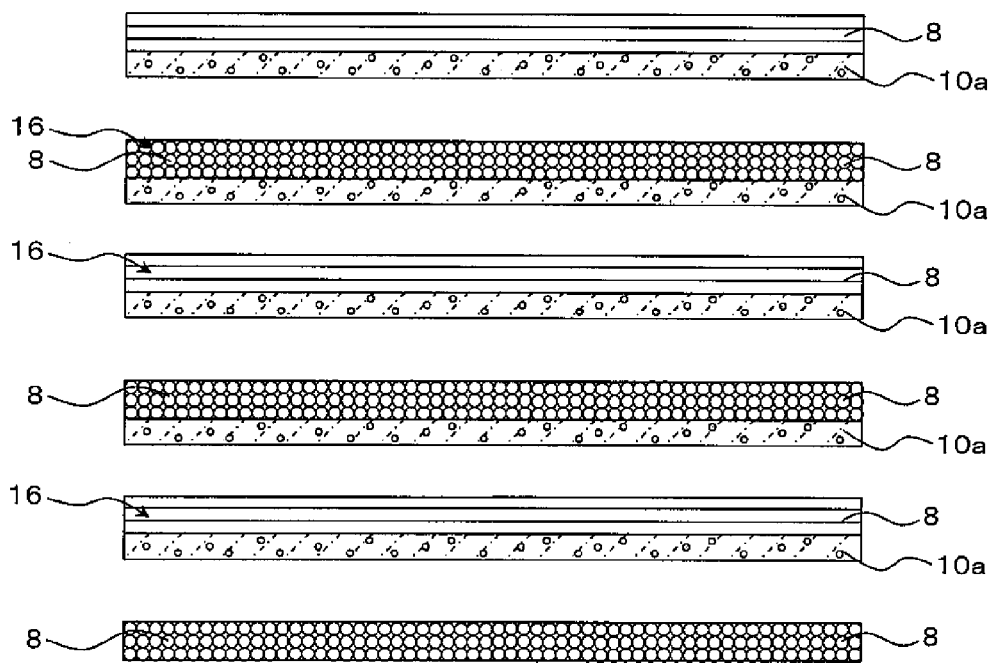
FIGS. 4A and 4B are sectional views illustrating a process of manufacturing a circuit board according to an embodiment of the present invention.

The base 5 can be produced through the following process. As illustrated in FIG. 4A, a plurality of fiber sheets 16 in which, for example, an epoxy resin is impregnated in the single fiber 8 made of a polyparaphenylene benzbisoxazole resin are prepared according to the thickness of the base 5 to be produced. In FIG. 4A, six fiber sheets 16 are prepared, and the fiber sheets 15 in which the single fibers 8 are arrayed along the X-direction and the fiber sheets 16 in which the single fibers 8 are arrayed along the Y-direction orthogonal to the X-direction are disposed so as to be alternately laminated. The number of fiber sheets 16 is not limited to six because the fiber sheets 16 are prepared according to the thickness of the base 5. The fiber sheet 16 acts as the fiber layer 9 after the thermal curing.

One surface of the fiber sheet 16 is previously coated with a resin material 10a made of, for example, an epoxy resin. The resin material 10a becomes the resin layer 10 after the thermal curing. A fiber sheet 16 is laminated on another fiber sheet 16 with the resin material 10a interposed therebetween such that end portions of the fiber sheets 16 are aligned with one another. The filler 13 made of, for example, silica is impregnated in the resin material 10a. The thickness of the thermally-cured resin layer 10 can be adjusted by controlling a content of the filler 13.

Figure 4B:
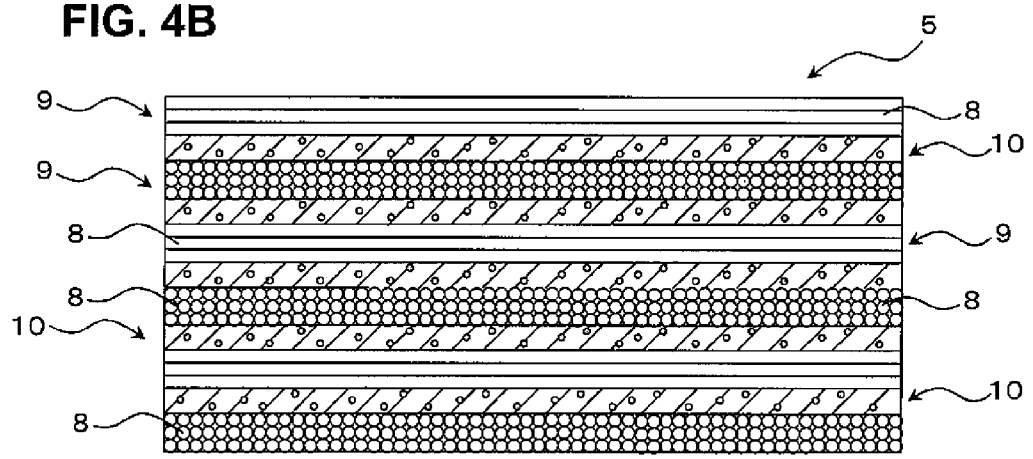

As illustrated in FIG. 4B, the laminated fiber sheets 16 are heated and pressurized with, for example, a hot press machine to thermally cure the resins included in the resin material 10a and fiber sheet 16, whereby the fiber sheets 16 can adhere to each other to produce the base 5. For example, the thickness of the base 5 is set to a range of 100 μm to 1200 μm.

Figure 5A:
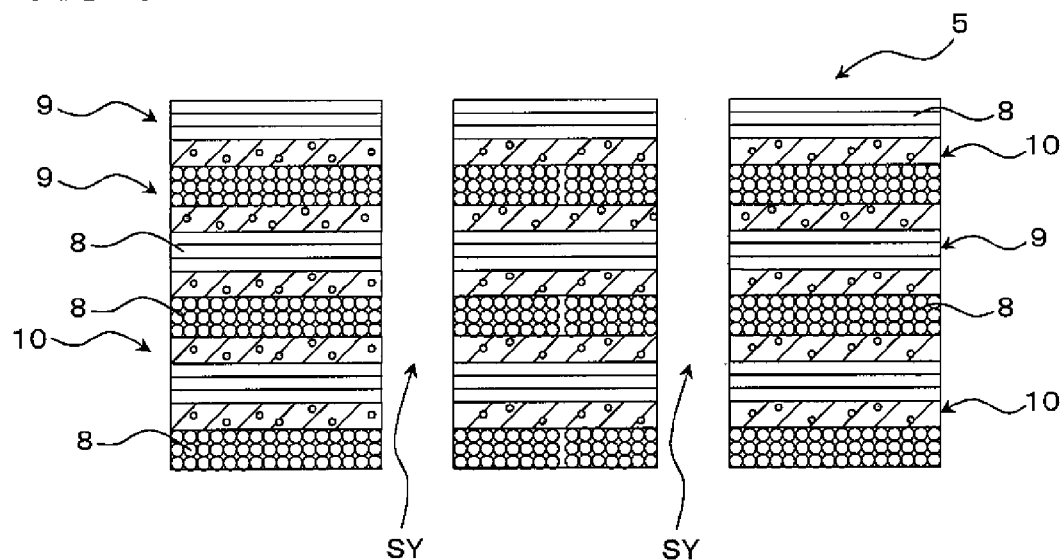
FIGS. 5A and 5B are sectional views illustrating a process of manufacturing a circuit board according to an embodiment of the present invention.

As illustrated in FIG. 5A, one principal surface of the produced base 5 is irradiated with a laser beam to bore part of the base 5 using, for example, a carbon dioxide gas laser apparatus or a YAG laser apparatus, thereby forming a cylindrical penetration hole SY. For example, in order to form the penetration hole SY, intensity of the laser beam ranges from 1 μJ (micro-joule) to 50 mJ (milli-joule) per pulse, and an irradiation time ranges from 10 n (nano) second to 500 n (nano) second per pulse.

Figure 5B:
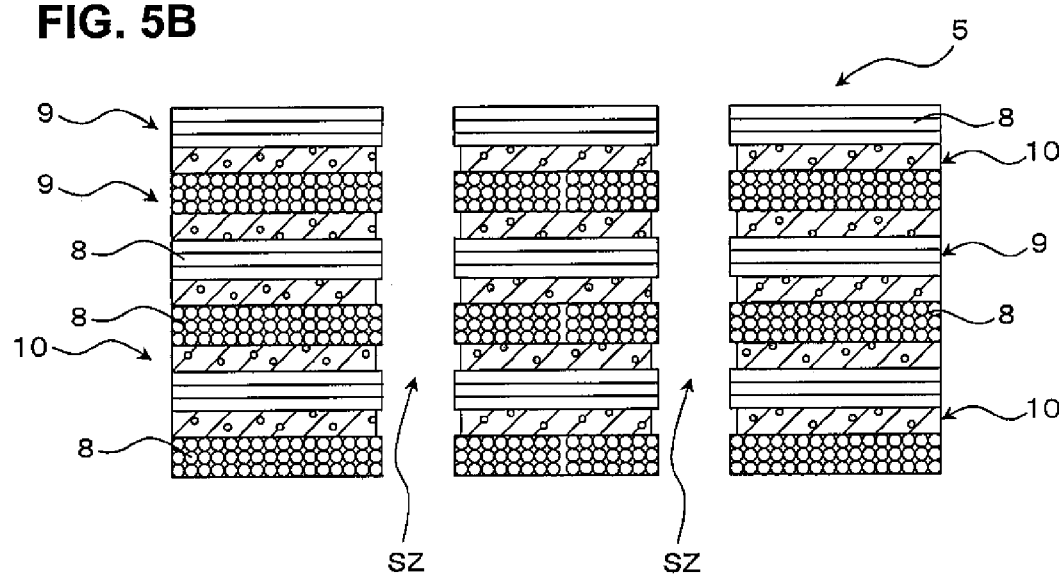

After the laser beam irradiation, the burned remainder (called smear) such as part of the single fiber 8 and part of the resin adheres to the inner wall surface of the penetration hole SY. As illustrated in FIG. 5B, the burned remainder in the penetration hole SY are removed to form a penetration hole SZ (called desmear). In the desmear process, for example, a microwave plasma treatment may be performed for about 10 minutes using argon gas plasma or oxygen gas plasma. A first etching solution is poured in order remove the burned remainder. At this point, part of the resin layer 10 is etched by 0.1 μm or less from the single fiber 8 using the first etching solution, and thus the single fiber 8 can be exposed from the inner wall surface of the penetration hole SZ. For example, the first etching solution is a permanganic acid aqueous solution in which permanganic acid of 20 to 40 g and potassium hydroxide of 35 to 45 g are added to distilled water of 1 liter. The first etching solution is heated to 30 to 40° C. and flows in the penetration hole SY for 2 to 4 minutes. The burned remainder (called smear) thermally influenced by the drill and laser can be etched by the plasma treatment and the etching solution on the above-described conditions, while the resin layer 10 can hardly be etched.

Figure 6A:
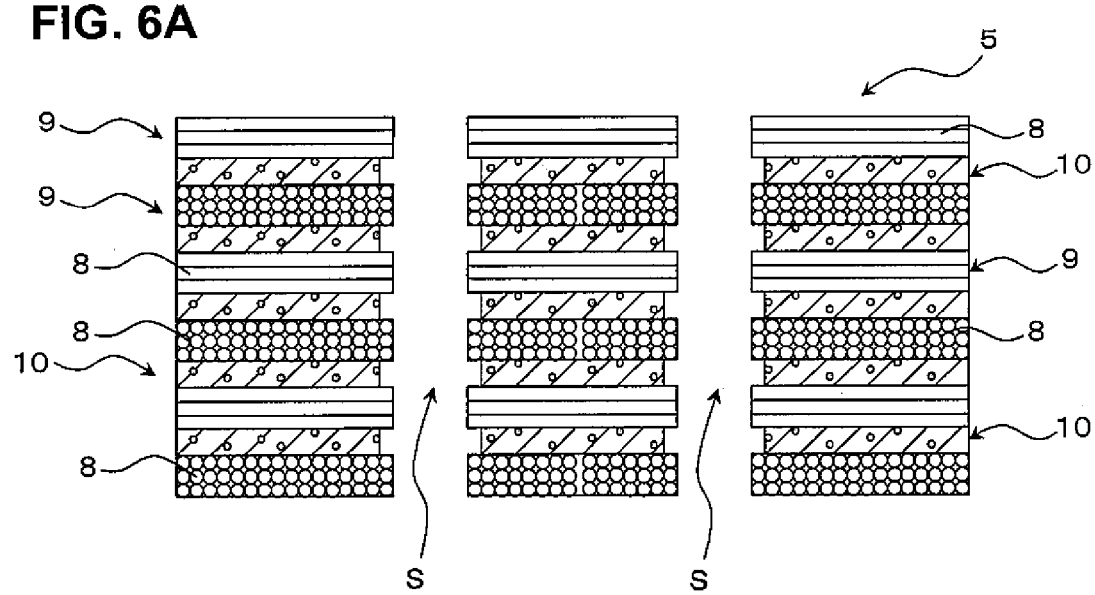
FIGS. 6A and 6B are sectional views illustrating a process of manufacturing a circuit board according to an embodiment of the present invention.

As illustrated in FIG. 6A, a second etching solution is poured in the penetration hole SZ, and part of the resin layer 10 is further etched by 0.5 μm to 30 μm in the X-direction to form a penetration hole S. For example, the second etching solution is a permanganic acid aqueous solution in which permanganic acid of 50 to 100 g and sodium hydroxide of 35 to 45 g are added to distilled water of 1 liter. The second etching solution is heated to 50 to 70° C. and flows in the penetration hole SZ for 5 to 6 minutes. The resin layer 10 can be etched by the second etching solution because the second etching solution has higher concentration and treatment temperature than the first etching solution. Because the single fiber 8 is made of resin that is excellent in the chemical resistance, heat resistance, and chemical and mechanical properties, the single fiber 8 is hardly etched even by the second etching solution. Stress applied from the resin to the single fiber 8 in the vertical direction is removed by the second etching solution, and the crack generated along the direction in which the molecules constituting the single fiber 8 are arrayed is opened by thermal shock of the laser beam, thereby forming the recess 8a.

In this manner, the projection 8a that is part of the single fiber 8 can be protruded from the inner wall surface of the penetration hole S to form the inner wall surface of the through hole S into the continuously irregular shape.

Figure 6B:
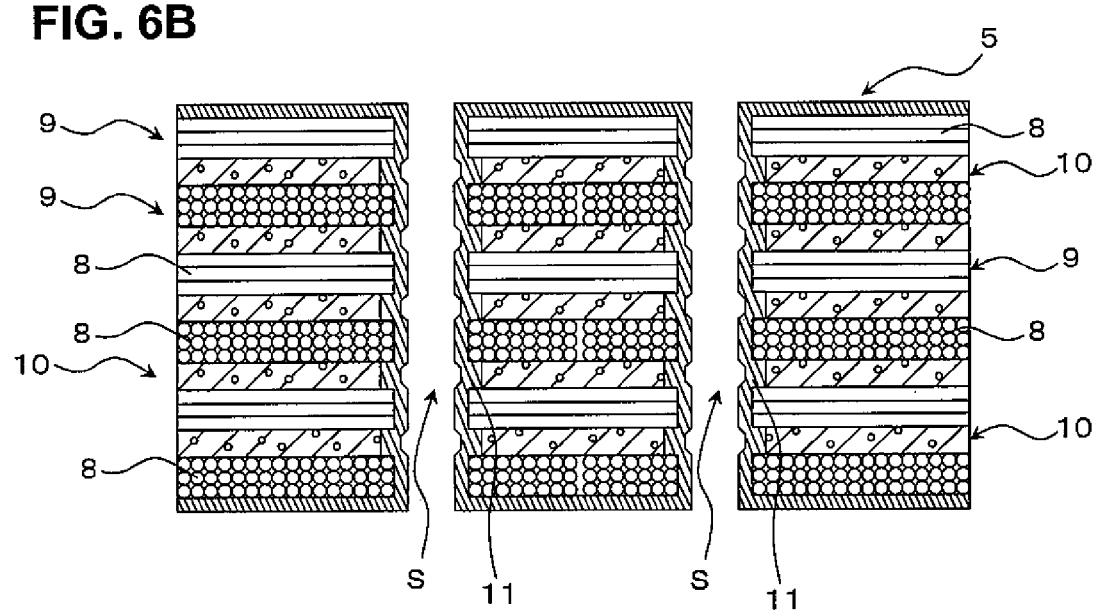

As illustrated in FIG. 6B, plating adheres to the surface of the base 5 by electroless plating or the like to form the through-hole conductor 11 along the inner wall surface of the through hole S.

Figure 7A:
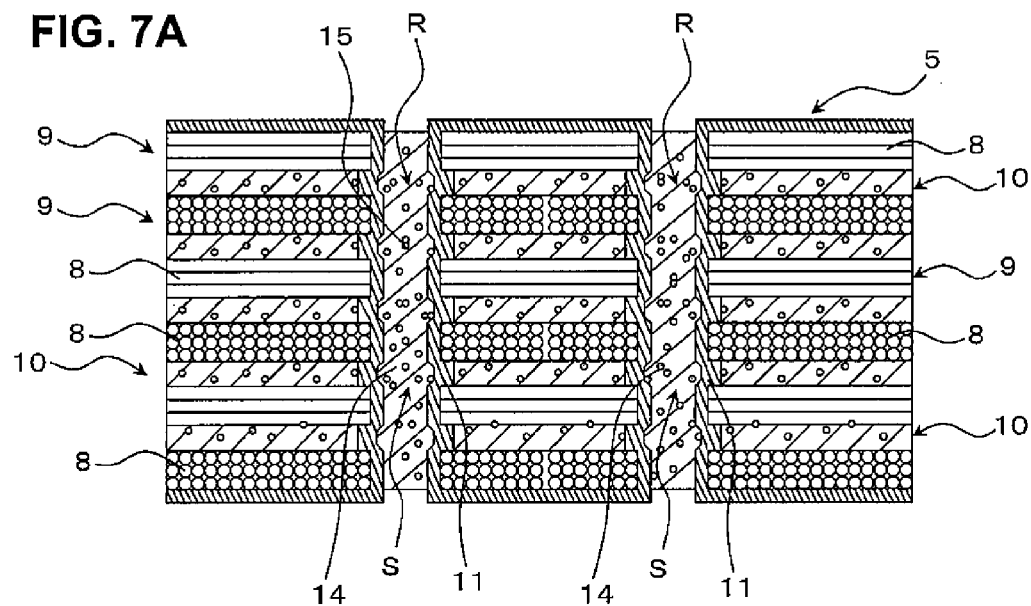
FIGS. 7A and 7B are sectional views illustrating a process of manufacturing a circuit board according to an embodiment of the present invention.

As illustrated in FIG. 7A, the region R surrounded by the through-hole conductor 11 is filled with resin such as polyimide, and the insulator 14 is formed by the thermal curing. Preferably the nonmetallic inorganic filler 15 is previously mixed in the resin of which the insulator 14 is made. When the nonmetallic inorganic filler 15 is included in the insulator 14, the thermal expansion coefficient of the insulator 14 can be decreased and brought close to the thermal expansion coefficient of the fiber layer 9 constituting the base 5, and the deformation of the whole of base 5 can be suppressed.

Figure 7B:
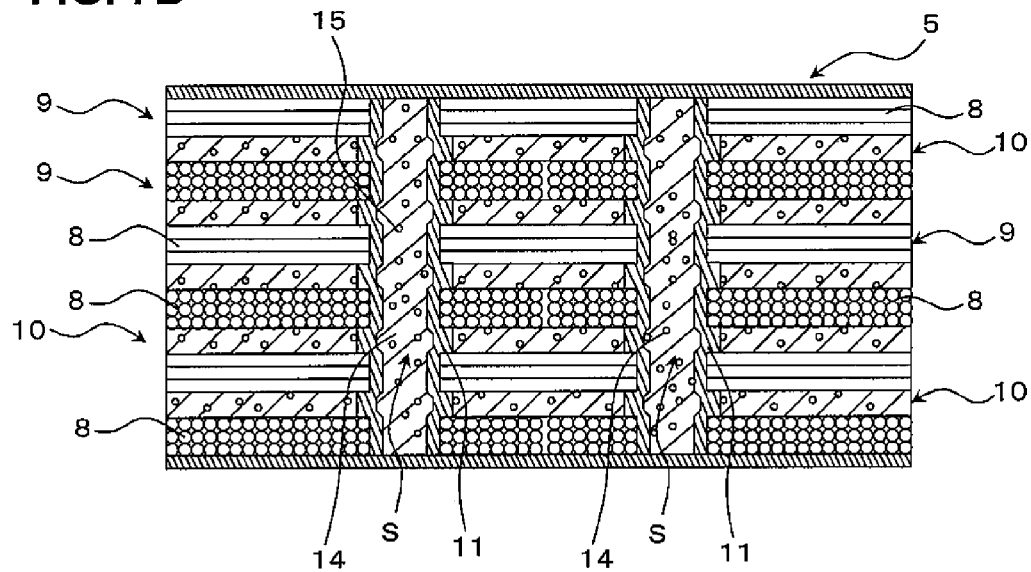

As illustrated in FIG. 7B, a material of the ground layer 6b is attached so as to coat portions immediately above and below the insulator 14 by a known evaporation method, CVD method, or sputtering method.

Figure 8A:
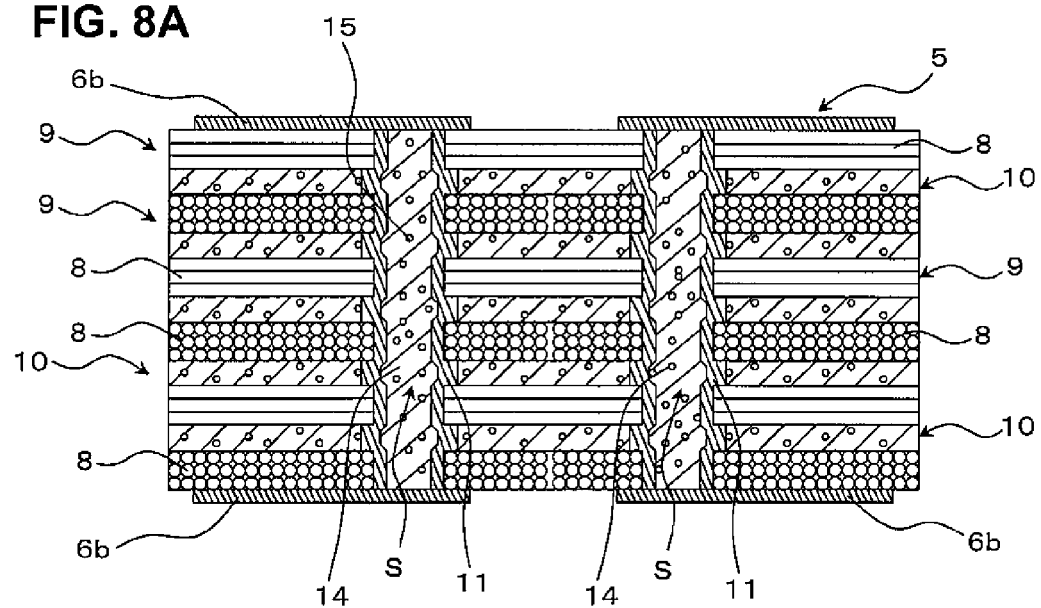
FIGS. 8A and 8B are sectional views illustrating a process of manufacturing a circuit board according to an embodiment of the present invention.
Figure 8B:
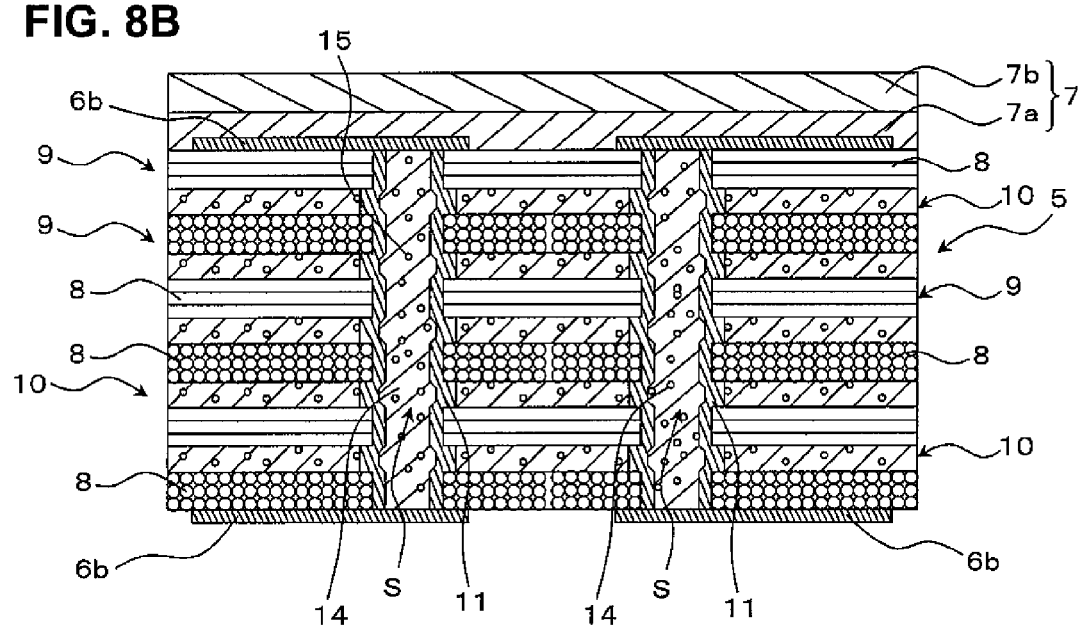

As illustrated in FIG. 8A, resists are applied onto one principal surface and the other principal surface of the base 5, and the etching treatment is performed after exposure and development are performed, thereby forming the ground layer 6b. As illustrated in FIG. 8B, the film layer 7b is attached to the ground layer 6b with the polyimide resin or the like interposed therebetween. The heating and pressurization are performed to fix the film layer 7b to the base 5 with, for example, the hot press machine. The resin adhered to the film layer 7b becomes the adhesion layer 7a after the curing. Accordingly, the insulating layer 7 including the adhesion layer 7a and the film layer 7b can be formed.

Figure 9A:
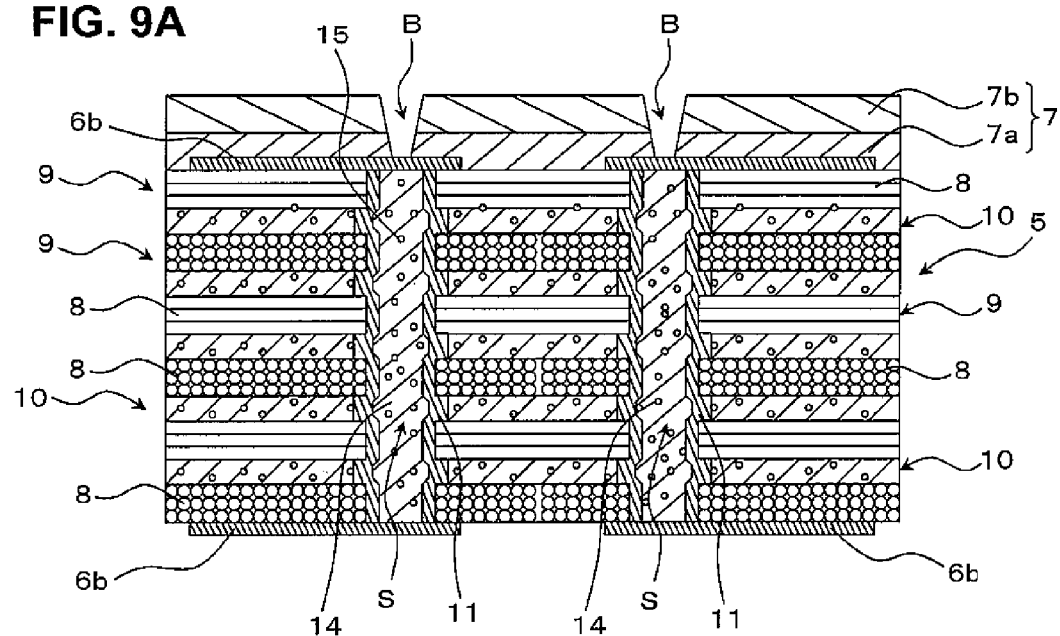
FIGS. 9A and 9B are sectional views illustrating a process of manufacturing a circuit board according to an embodiment of the present invention.
Figure 9B:
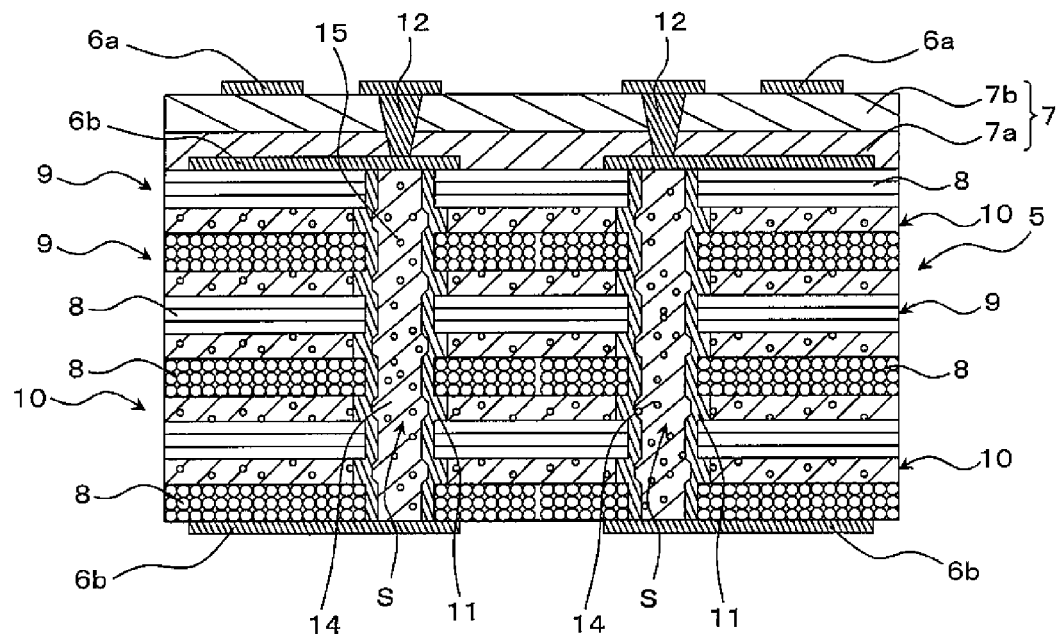

As illustrated in FIG. 9A, a via hole B is formed in the insulating layer 7 using, for example, the YAG laser apparatus or the carbon dioxide gas laser apparatus. The via hole B is formed by irradiating one principal surface of the insulating layer 7 with the laser beam from the direction perpendicular to one principal surface of the insulating layer 7. The via hole B can be formed into a reverse tapered shape in which a lower portion is narrower than an upper portion by adjusting laser output. As illustrated in FIG. 9B, a known plating treatment is performed to the via hole B, and the via hole B is filled with the conductive material to form the via conductor 12.

The material of the signal line 6a is attached to the upper surface of the insulating layer 7 by a known evaporation method, CVD method, or sputtering method. The resist is applied to the surface of the insulating layer 7, and the etching treatment is performed after the exposure and development are performed, thereby forming the signal line 6a. The signal line 6a is formed at the point at which the signal line 6a is opposite to the ground layer 6b with the insulating layer 7 interposed therebetween. Accordingly, the circuit board 2 can be produced.

The multilayer circuit board can also be produced by repeating a process of laminating the insulating layer 7 and the conductive layer 6. The semiconductor element 4 is flip-chip-mounted on the circuit board 2 with the bump 3 interposed therebetween, thereby producing the mounting structure 1.

The present invention is not limited to the above embodiment, but various changes and modifications can be made without departing from the scope of the invention. For example, the direction of the single fiber 8 and the orientation of the fiber layer 9 may appropriately be selected according to the design of the circuit board.

The invention claimed is:

1. A circuit board comprising:
   a base that includes a fiber layer including a plurality of single fibers arrayed in one direction and a resin coating the single fibers, and
   a through hole penetrating the fiber layer; and
   a through-hole conductor that is formed in the through hole,
   wherein the single fiber has a protruded part which is protruded from an inner wall surface of the through hole toward the through-hole conductor side, and the protruded part is coated with the through-hole conductor.

2. The circuit board according to claim 1, wherein, in the protruded parts of the single fiber, the protruded parts protruded along a longitudinal direction of the single fiber has a recess along the longitudinal direction in a surface of an end portion thereof, and
   the recess is filled with part of the through-hole conductor.

3. The circuit board according to claim 2, wherein a plurality of the protruded parts are provided, and
   the plurality of protruded parts are disposed symmetrically with respect to a virtual axis when viewed from above, the virtual, axis passing through a center of the through hole while being orthogonal to the longitudinal direction of the single fiber.

4. The circuit board according to claim 1, wherein the base is a laminated body in which the fiber layers including the single fibers and the resin layers are alternately laminated, the through hole is formed so as to penetrate the plurality of fiber layers and the plurality of resin layers, and the protruded parts of the single fiber is formed in the fiber layer which the through hole penetrates.

5. The circuit board according to claim 3, wherein part of the through-hole conductor is interposed between the protruded parts.

6. The circuit board according to claim 1, wherein the single fiber is made of a polyparaphenylene benzbisoxazole resin.

7. A mounting structure comprising: the circuit board according to any one of claim 1 or 2 or 3 or 4 or 5 or 6; and a semiconductor element that is mounted on the circuit board.

8. A circuit board manufacturing method comprising the steps of:

preparing a base that includes a fiber layer including a plurality of single fibers and a resin coating the single fibers;

forming a through hole in the fiber layer, part of the single fiber being protruded from an inner wall surface of the through hole; and forming, along the inner wall surface of the through hole, a through-hole conductor coating the part of the single fiber protruded from the inner wall surface of the through hole, wherein the step of forming the through hole includes the steps of:

forming a penetration hole in the fiber layer; and forming the penetration hole into the through hole by etching part of the resin exposed to the inner wall surface of the penetration hole to protrude part of the single fiber.

9. The circuit board manufacturing method according to claim 8, wherein the step of forming the penetration hole includes the step of irradiating the base with a laser beam to remove part of the base, and the step of forming the penetration hole into the through hole includes the steps of:

pouring a first etching solution to flow in the penetration hole and removing a residual material in the penetration hole; and pouring a second etching solution to flow in the penetration hole and etching the resin in the penetration hole deeper than the single fiber.

* * * * *